United States Patent [19]

Faure et al.

[11] Patent Number: 5,296,085
[45] Date of Patent: Mar. 22, 1994

[54] MACROCRYSTALLINE α-ALUMINA HEXAGONAL PLATELETS

[75] Inventors: Annick Faure, Venissieux; Roland Bachelard, Lyons, both of France

[73] Assignee: Atochem, Puteaux, France

[21] Appl. No.: 918,787

[22] Filed: Jul. 27, 1992

Related U.S. Application Data

[63] Continuation of Ser. No. 756,785, Sep. 9, 1991, abandoned, which is a continuation of Ser. No. 586,224, Sep. 21, 1990, abandoned.

[30] Foreign Application Priority Data

Sep. 21, 1989 [FR] France ................... 89/12402

[51] Int. Cl.$^5$ ............... C30B 29/64; C30B 30/00
[52] U.S. Cl. ................... 156/603; 423/628; 423/629; 51/309; 501/153
[58] Field of Search ............... 423/625–629; 156/603; 501/3

[56] References Cited

U.S. PATENT DOCUMENTS

| | | | |
|---|---|---|---|
| 3,915,662 | 10/1975 | Labelle et al. | 23/301 SP |
| 4,125,406 | 11/1978 | Sowman | 106/57 |
| 4,130,402 | 12/1978 | Schepers et al. | 423/625 |
| 4,308,088 | 12/1981 | Cherdon et al. | 423/625 |
| 4,379,134 | 4/1983 | Weber et al. | 423/626 |
| 4,390,508 | 6/1983 | Watanabe et al. | 423/625 |
| 4,477,427 | 10/1984 | Matyasi et al. | 423/625 |
| 4,822,592 | 4/1989 | Misra | 423/627 |
| 4,881,951 | 11/1989 | Wood et al. | 51/309 |
| 4,983,556 | 1/1991 | Seike et al. | 501/153 |
| 4,994,588 | 2/1991 | Kapicak et al. | 549/534 |
| 4,996,177 | 2/1991 | Takagi et al. | 501/153 |
| 5,017,524 | 5/1991 | Moskowitz et al. | 501/87 |

Primary Examiner—Mark L. Bell
Assistant Examiner—Margaret Einsmann
Attorney, Agent, or Firm—Burns, Doane, Swecker & Mathis

[57] ABSTRACT

Macrocrystalline α-alumina hexagonal platelets, well adapted as reinforcing materials and polishing agents, are prepared by calcining admixture of transition or hydrated alumina and a fluorocompound flux, such fluorocompound flux having a melting point of up to 800° C. and, in the molten state, serving to dissolve the transition/hydrated alumina.

26 Claims, No Drawings

MACROCRYSTALLINE α-ALUMINA HEXAGONAL PLATELETS

This application is a continuation, of application Ser. No. 07/756,785, now abandoned, filed Sep. 9, 1991, a continuation of application Ser. No. 07/586,224 filed on Sep. 21, 1990, now abandoned.

BACKGROUND OF THE INVENTION

1. Field of the Invention:

The present invention relates to novel macrocrystals of α-alumina, or aluminum oxide or corundum, in the form of hexagonal platelets and to a process for the preparation of such novel crystals from aluminum oxide or aluminum hydroxide.

2. Description of the Prior Art:

The preparation of macrocrystals of alumina from aluminum hydroxide is known to this art. Thus, French Patent No. 2,441,584 describes macrocrystals of α-alumina in the form of hexagonal platelets having a particle size ranging from 16 to 250 μm and a diameter/thickness ratio ranging from 3/1 to 7/1, such macrocrystals being prepared by calcination of aluminum hydroxide at a temperature ranging from 1,200° C. to 1,450° C. in the presence of a mineralizing agent containing 0.001% to 0.5% by weight of fluorinated compounds.

Published German Patent Application DE-OS 2,623,482 describes the preparation of primary crystals having an average size ranging from 16 to 25 μm by calcination of aluminum hydroxide in the presence of at least one fluorinated salt and a vanadium salt.

According to the above '584 French patent (page 2, lines 19-22), increasing the temperature or the use of other mineralizing agents has no or virtually no influence on the size and the shape of the crystals.

Moreover, Keiji Daimon and Etsun Kato, in Yogyo Kvokai Shi, 94, [3], pp. 380-382 [78-80] (1986), describes the production of hexagonal platelets of α-alumina having a diameter ranging from 1.5 to 40 μm from hydrated aluminum sulfate in the presence of aluminum trifluoride.

Published Japanese Patent Application No. 60/54,916 describes the preparation of platelets having an average diameter of 1.7 μm and a thickness of 0.18 μm from a mixture of hydrated aluminum sulfate and an alkali metal carbonate.

Published Japanese Patent Application No. 60/38,486 describes the preparation of platelets having a thickness of less than 5 μm and a diameter (derived from the diameter/thickness ratio) ranging from 25 to 150 μm.

And Russian Patent No. 416,313 describes the preparation of hexagonal platelets of alumina which have a diameter ranging from 4 to 12 μm by thermal dissociation of an aluminum compound in the presence of hexagonal alumina seed material at 1,170° C.

Finally, B. P. Locsel, in INTERCERAM, No. 3 (1981), describes the preparation of α-alumina crystals having a diameter/thickness ratio ranging from 6 to 10 from bauxite having a low ferric oxide content, in the presence of aluminum trifluoride.

SUMMARY OF THE INVENTION

The present invention features novel macrocrystals of α-alumina, essentially in the form of monocrystalline hexagonal platelets, such platelets being characterized by a diameter ranging from 2 to 20 μm, a thickness ranging from 0.1 to 2 μm and a diameter/thickness ratio ranging from 5 to 40.

In a preferred embodiment of the present invention, the subject novel macrocrystals of α-alumina are in the form of hexagonal platelets having a diameter ranging from 2 to 18 μm, a thickness ranging from 0.1 to 1 μm and a diameter/thickness ratio ranging from 5 to 40.

This invention also features a process for the production of α-alumina in the form of essentially hexagonal platelets as described above, comprising calcining transition alumina or hydrated alumina in the presence of a flux having a melting point of at most 800° C., containing chemically bonded fluorine and, in the molten state, capable of dissolving the transition alumina or hydrated alumina.

DETAILED DESCRIPTION OF THE PREFERRED EMBODIMENTS OF THE INVENTION

More particularly according to the present invention, by the term "transition alumina or hydrated alumina" are intended all types of aluminum oxide or aluminum hydroxide, with the exception of α-alumina.

The flux, also designated the "mineralizing agent", having the characteristics described above, essentially consists of one or more non-hydrolyzable fluorinated compounds, or a system including one phase comprising said non-hydrolyzable, fluorinated compound or compounds and another phase comprising a hydrolyzable fluorinated compound, one of such phases being dissolved in the other phase.

The systems comprising aluminum trifluoride and one or more alkali metal fluorides or alkaline earth metal fluorides, and especially lithium fluoride, sodium fluoride, potassium fluoride or calcium fluoride, are particularly representative of the aforesaid fluxes. More specifically exemplary is the system $AlF_3$-$LiF$ in the form $Li_3AlF_6$ (lithium cryolite) or $Li_3Na_3(AlF_6)_2$ (cryolithionite) or $3AlF_3$, $5LiF$ (lithium chiolite).

The fluxes according to the invention are in the form of powder, the particle size of which is preferably less than 1 mm (for at least 50% by weight of the particles).

When carrying out the process according to the invention, at least 2% and preferably 4% to 20% by weight of flux are used relative to the weight of the starting material transition alumina or hydrated alumina.

The transition alumina or hydrated alumina can be selected from a wide variety of products and powders of various diameters and specific surface areas. The aluminas in which at least 50% by weight of the particles have a diameter of less than 50 μm, preferably less than 25 μm and even more preferably about 1.5 μm, are very particularly representative. The preferred such aluminas have a specific surface area equal to or greater than 100 $m^2/g$ (measured by the BET method), more preferably ranging from 100 to 400 $m^2/g$.

Although dried aluminas may be used, the preferred types are non-dried or hydrated ($Al_2O_3 \cdot H_2O$), it being possible for the water content to be up to 15% of the weight of the alumina.

The calcination temperature can be up to 1,200° C. or even higher. However, in a preferred embodiment of the invention, the calcination can be carried out at a very much lower temperature, for example ranging from 900° to 1,100° C.

In general, the mixture of transition alumina or hydrated alumina/flux, prepared by the typical techniques for powder mixtures, can be placed at ambient temperature in a heating chamber, the temperature being progressively increased to the aforementioned values. The temperature is advantageously rapidly increased, namely, on the order of 1,000° C. in 1 hour, the aforesaid rate of temperature increase being illustrative only.

The calcination is advantageously carried out in an inert atmosphere, for example under a gentle stream of nitrogen. Once the calcination temperature has been attained, which temperature, as aforesaid, can range from 900° to 1,100° C. and preferably is about 1,000° C., it is advantageous to maintain such temperature for a period of time which can range from one-half an hour to a few hours (for example up to 5 hours).

Upon completion of the calcination operation, the platelets can be chilled, or they can be allowed to cool naturally or in a refrigerated chamber, as desired.

The platelets recovered essentially (>95% by weight) consist of α-alumina, which may be associated with the flux or with a product derived from the flux, such as $Al_4LiO_6F$ in the case of $Li_3AlF_6$. The flux or its derivative can be removed, for example by the action of a concentrated acid ($H_2SO_4$ or HCl), under hot conditions (for example around 100° C.).

The hexagonal platelets of α-alumina of the present invention are suitable for numerous applications. They can be used, in particular, for the production of polishing compounds and as reinforcing materials for diverse materials, in particular ceramic matrices and metal and polymer matrices, whether alone or in combination with fibers, particles or whiskers.

In order to further illustrate the present invention and the advantages thereof, the following specific examples are given, it being understood that same are intended only as illustrative and in nowise limitative.

EXAMPLES 1 to 14

The apparatus employed was a furnace heated by a quartz tube in which a stream of nitrogen could be circulated and into which sintered aluminum crucibles containing the powder to be calcined were introduced.

The following aluminas were used ($D_x = Y$ μm indicates that X % of the particles (by weight) had a diameter smaller than Y μm):

$P_1$: gamma-$Al_2O_3$ $D_{50} = 1.1$ μm specific surface area = 172 m²/g $P_2$: gamma-$Al_2O_3$ $D_{50} = 4.6$ μm specific surface area = 100 m²/g $P_3$: $Al_2O_3 \cdot H_2O$ (boehmite) $D_{60} = 25$ μm $D_{96} = 45$ μm specific surface area = 196 m²/g $P_4$: gamma-$Al_2O_3$ $D_{55} = 25$ μm $D_{97} = 45$ μm specific surface area = 244 m²/g $P_5$: gamma-$Al_2O_3$ $D_{50} = 3.5$ μm.

The following fluxes were used ($D_{50} =$ μm having the definition given above and D corresponding to all of the particles) in an amount of 5% by weight relative to the weight of alumina ($P_1$ to $P_5$):

| | | |
|---|---|---|
| $F_1$: $Li_3AlF_6$ | (m.p.: 776° C.) | $D_{50} = 0.9$ μm |
| $F_2$: $Li_3AlF_6$ | | $400 < D < 600$ μm |
| $F_3$: $Li_3AlF_6$ | | $D > 630$ μm |
| $F_4$: $Li_3AlF_6$ | | $160 < D < 400$ μm |
| $F_5$: $Li_3Na_3(AlF_6)_2$ | (m.p.: 710° C.) | |
| $F_6$: $3AlF_3, 5LiF$ | | |

The mixtures of aluminas and flux were prepared at ambient temperature and then placed in crucibles and the latter were introduced into the furnace, under a stream of nitrogen (10 l/h).

The temperature of the furnace was increased to X° C. over the course of one hour (gradient) and then maintained at this temperature for Z hours (plateau).

Cooling was carried out in ambient air.

The product obtained was a white block which released from the mold and deagglomerated easily. The average diameter d (in μm) and the average thickness e (in μm) of the platelets formed were measured.

The conditions and results obtained are reported in the Table which follows:

TABLE

| | | | CALCINATION | | Dimensions of the platelets | |
|---|---|---|---|---|---|---|
| Examples | Alumina | Flux | X° C. | Plateau (Z) | d | e |
| 1 | $P_1$ | $F_1$ | 980 | 1 | 7 | 0.5 |
| 2 | $P_2$ | $F_1$ | 980 | 1 | 16 | 0.5 |
| 3 | $P_3$ | $F_1$ | 980 | 1 | 16 | 1 |
| 4 | $P_4$ | $F_1$ | 980 | 1 | 8 | 1 |
| 5 | $P_5$ | $F_1$ | 980 | 1 | 4 | 0.3 |
| 6 | $P_1$ | $F_2$ | 980 | 1 | 5 | 0.7 |
| 7 | $P_1$ | $F_3$ | 980 | 1 | 5 | 0.7 |
| 8 | $P_1$ | $F_4$ | 980 | 1 | 10 | 0.5 |
| 9 | $P_2$ | $F_4$ | 980 | 1 | 9 | 1 |
| 10 | $P_1$ | $F_1$ | 980 | ½ | 7 | 0.5 |
| 11 | $P_1$ | $F_1$ | 980 | 2 | 7 | 0.5 |
| 12 | $P_1$ | $F_1$ | 850 | 1 | 7 | 0.5 |
| 13 | $P_1$ | $F_1$ | 1,100 | 1 | 7 | 0.5 |
| 14 | $P_1$ | $F_5$ | 980 | 1 | 8 | 0.5 |
| 15 | $P_1$ | $F_6$ | 980 | 1 | 7 | 0.5 |

While the invention has been described in terms of various preferred embodiments, the skilled artisan will appreciate that various modifications, substitutions, omissions, and changes may be made without departing from the spirit thereof. Accordingly, it is intended that the scope of the present invention be limited solely by the scope of the following claims, including equivalents thereof.

What is claimed is:

1. α-Alumina macrocrystals comprising monocrystalline hexagonal platelets having a diameter ranging from 2 to 20 μm, a thickness ranging from 0.1 to less than 1 μm and a diameter/thickness aspect ratio ranging from 5 to 40.

2. The α-alumina macrocrystals as defined by claim 1, said hexagonal platelets having a diameter ranging from 2 to 18 μm.

3. The α-alumina macrocrystals as defined by claim 1, consisting essentially of said hexagonal platelets having a diameter ranging from 7 to 16 μm.

4. The α-alumina macrocrystals as defined by claim 1, consisting essentially of α-alumina.

5. A polishing compound comprising the α-alumina macrocrystals as defined by claim 1.

6. A composite shaped article comprising a ceramic, metal or polymer matrix and a reinforcing amount of a filler material therefor, said filler material comprising the α-alumina macrocrystals as defined by claim 1.

7. A process for the preparation of α-alumina macrocrystals comprising monocrystalline hexagonal platelets having a diameter ranging from 2 to 20 μm, a thickness ranging from 0.1 to 2 μm and a diameter/thickness aspect ratio ranging from 5 to 40, comprising calcining admixture of transition or hydrated alumina and a fluorocompound flux, said fluorocompound flux having a melting point of up to 800° C. and, in the molten state, serving to dissolve said transition/hydrated alumina, the fluorocompound flux being present in an amount sufficient to dissolve the transition/hydrated alumina during said calcining.

8. The process as defined by claim 7, said fluorocompound flux consisting essentially of at least one non-hydrolyzable fluorinated compound.

9. The process as defined by claim 7, said fluorocompound flux including a first phase comprising at least one non-hydrolyzable fluorinated Compound and a second phase comprising at least one hydrolyzable fluorinated compound, one of said first and second phases being dissolved in the other.

10. The process as defined by claim 9, said fluorocompound flux comprising aluminum trifluoride and at least one alkali or alkaline earth metal fluoride.

11. The process as defined by claim 10, said fluorocompound flux comprising at least lithium fluoride, sodium fluoride, potassium fluoride or calcium fluoride.

12. The process as defined by claim 7, said fluorocompound flux comprising $Li_3AlF_6$, $Li_3Na_3(AlF_6)_2$ or $3AlF_3, 5LiF$.

13. The process as defined by claim 7, wherein the amount, by weight, of said fluorocompound flux is at least 2% relative to the weight of said transition/hydrated alumina.

14. The process as defined by claim 13, said amount ranging from 4% to 20% by weight.

15. The process as defined by claim 7, said transition/hydrated alumina comprising a powder, at least 50% by weight of the particulates of which having a diameter of less than 50 μm and said powder having a specific surface area greater than 100 $m^2/g$.

16. The process as defined by claim 7, said transition/hydrated alumina comprising up to 15% by weight of water.

17. The process as defined by claim 7, comprising calcining at a temperature ranging from 900° to 1,100° C.

18. The process as defined by claim 7, wherein the transition or hydrated alumina consists essentially of gamma alumina.

19. The process as defined by claim 7, wherein the transition or hydrated alumina consists essentially of boehmite.

20. A process for the preparation of α-alumina macrocrystals comprising monocrystalline hexagonal platelets having a diameter ranging from 2 to 20 μm, a thickness ranging from 0.1 to 2 μm and a diameter/thickness aspect ratio ranging from 5 to 40, comprising calcining admixture of transition or hydrated alumina and a fluorocompound flux, said fluorocompound flux having a melting point of up to 800° C. and, in the molten state, serving to dissolve said transition/hydrated alumina, the fluorocompound flux consisting essentially of a B-free fluorocompound flux.

21. A process for the preparation of α-alumina macrocrystals comprising monocrystalline hexagonal platelets having a diameter ranging from 2 to 20 μm, a thickness ranging from 0.1 to 2 μm and a diameter/thickness aspect ratio ranging from 5 to 40, comprising calcining admixture of transition or hydrated alumina and a fluorocompound flux, said fluorocompound flux having a melting point of up to 800° C. and, in the molten state, serving to dissolve said transition/hydrated alumina, said fluorocompound flux comprising $Li_3Na_3(AlF_6)_2$.

22. The process as defined by claim 7, further comprising removing the flux from the platelets.

23. The process as defined by claim 22, wherein the flux is removed with acid.

24. The process as defined by claim 23, wherein the flux is removed by the action of a concentrated acid under hot conditions.

25. The α-Alumina macrocrystals according to claim 1, wherein said thickness ranges from 0.3 to less than 1 μm.

26. The α-Alumina macrocrystals according to claim 25, wherein said diameter ranges from 4 to 20 μm.

* * * * *